US006956449B2

(12) United States Patent
Snyder et al.

(10) Patent No.: US 6,956,449 B2
(45) Date of Patent: Oct. 18, 2005

(54) QUADRATURE HYBRID LOW LOSS DIRECTIONAL COUPLER

(75) Inventors: Robert F. Snyder, New Freedom, PA (US); Mark A. Hilbert, York, PA (US)

(73) Assignee: Andrew Corporation, Orland Park, IL (US)

( * ) Notice: Subject to any disclaimer, the term of this patent is extended or adjusted under 35 U.S.C. 154(b) by 38 days.

(21) Appl. No.: 10/351,931

(22) Filed: Jan. 27, 2003

(65) Prior Publication Data

US 2004/0145427 A1 Jul. 29, 2004

(51) Int. Cl.[7] .................................................. H01P 3/08
(52) U.S. Cl. ....................................... 333/116; 333/238
(58) Field of Search ........................... 333/26, 27, 109, 333/111, 112, 113, 114, 115, 116, 117, 118, 119, 185, 238, 243

(56) References Cited

U.S. PATENT DOCUMENTS

| | | | | | |
|---|---|---|---|---|---|
| 3,626,332 | A | | 12/1971 | Barbatoe | 333/116 |
| 4,488,111 | A | | 12/1984 | Widdowson | 324/762 |
| 4,737,740 | A | | 4/1988 | Millican et al. | 333/116 |
| 4,821,007 | A | | 4/1989 | Fields et al. | 333/238 |
| 5,006,821 | A | | 4/1991 | Tam | 333/116 |
| 5,138,436 | A | * | 8/1992 | Koepf | 257/728 |
| 5,349,364 | A | | 9/1994 | Bryanos et al. | 343/853 |
| 5,359,304 | A | | 10/1994 | Fujiki | 333/116 |
| 5,369,379 | A | | 11/1994 | Fujiki | 333/116 |
| 5,382,925 | A | | 1/1995 | Hayashi et al. | 333/112 |
| 5,438,697 | A | | 8/1995 | Fowler et al. | 455/347 |
| 5,486,798 | A | | 1/1996 | Veitschegger | 333/116 |
| 5,742,210 | A | | 4/1998 | Chaturvedi et al. | 333/116 |
| 5,841,328 | A | | 11/1998 | Hayashi | 333/116 |
| 6,208,220 | B1 | | 3/2001 | Logothetis | 333/116 |
| 6,437,661 | B2 | | 8/2002 | Nishimura et al. | 333/116 |

FOREIGN PATENT DOCUMENTS

| | | | |
|---|---|---|---|
| JP | 3-295302 | 12/1991 | H01P/5/18 |
| JP | 4-26201 | 1/1992 | H01P/5/18 |
| JP | 5-110314 | 4/1993 | H01P/5/18 |

* cited by examiner

*Primary Examiner*—Dean Takaoka
(74) *Attorney, Agent, or Firm*—Wood, Herron & Evans, LLP

(57) ABSTRACT

A coupling device defined by an RF circuit board having a cavity formed therein and a plurality of conductive traces and a ground plane, a coupler board having opposites sides and conductive traces, and first and, second metal shields. When assembled, the coupler board is supported by the RF circuit board, and cavities are formed on opposite sides of the coupler board by the first and second metal shields.

32 Claims, 3 Drawing Sheets

QUADRATURE HYBRID LOW LOSS DIRECTIONAL COUPLER

FIELD OF THE INVENTION

The present invention relates to microwave radio frequency (RF) couplers, and more specifically, to addressing the losses inherent in such couplers.

BACKGROUND OF THE INVENTION

A hybrid directional coupler is a four port electromagnetic device that is configured to provide an output that is proportional solely to the power incident from a source. For a given bandwidth, a hybrid directional coupler will divide the incident power that is input to one port between two other output ports at quadrature phase. The relative power at each other port with respect to the incident power at the input port will be known based upon the impedances coupled to the various output ports of the device.

Quadrature hybrid directional couplers are used in communications equipment. Such couplers allow a sample of a communications signal that is input at an input port and output at an output or "direct" port, to be taken from the signal at third or "coupled" port. Similarly, there will be no appreciable signal at the fourth or "isolated" port. When appropriately designed, a directional coupler may discern between a signal input at the input port and a signal input at the direct or output port. Such ability to discern the signals is particularly useful when, for example, a coupler is coupled intermediate an RF amplifier and an antenna. In such a configuration, the output of the RF amplifier may be monitored independently from that of a signal reflected from a mismatched antenna. Moreover, such a monitored signal may be used to control the gain (e.g., automatic gain control (AGC)), or reduce the distortion of the RF amplifier.

Directional couplers have been constructed in a variety of different designs. Initially, directional couplers were constructed by sandwiching conductive copper strips or traces between pieces of dielectric material, such as polyolefin or Teflon. Directional couplers were also constructed by locating the inner conductors of two coaxial cables in close proximity with each other, and surrounding them with a common outer conductor. Directional couplers constructed using conductive traces deposited on dielectric materials also included metal containers for housing the dielectrics with, coaxial connectors mounted to the containers to provide connections to the traces. Today such construction techniques are typically used only for high power applications, and may or may not use dielectric materials.

Subsequently, directional couplers were developed without bulky metal housings and coaxial connectors, thereby reducing the size, weight, and cost, and improving the manufacturing of the couplers, as the well as the products using these couplers. These miniaturized directional couplers, often referred to as "filmbrids", are laminated stripline assemblies that may be bonded together by fusion or by thermoplastic or thermoset films, and are often dispensed from reels and wave soldered onto land areas on circuit boards.

Many ways of constructing directional couplers have been developed; however, practically all of these designs suffer from insertion losses. Insertions losses may be generally attributed to the conductors and dielectric materials used in the construction of many couplers upon which the conductors are deposited, etched or otherwise placed. For example, dielectric materials absorb some of the power applied to a coupler, resulting in throughput or insertion losses. Such losses are particularly troublesome when a coupler is coupled intermediate an RF amplifier and an antenna, since such losses require more amplifier output to overcome the losses inherent in the coupler.

The relative propensity of the dielectric materials in couplers to absorb energy is generally designated by tan(d), the dielectric absorption factor or constant, and is related to air (tan(d)=0). The higher the loss tangent (tan(d)) or loss factor, and the more dielectric material used, the greater the amount of energy absorbed and the greater the losses.

For example, the dielectric absorption factor for pure Teflon (PTFE) is on the order of 0.0006, however pure Teflon is typically unworkable and impractical for use in couplers. As a result, a material, such as fiberglass, may be added to Teflon to provide strength and workability, the dielectric absorption factor there being on the order of 0.001. Other materials typically have dielectric absorption factors on the order of 0.03 or greater. Thus, for a like sized dielectric, a material with a higher dielectric absorption factor will absorb more energy than a material with a lower dielectric absorption factor, resulting in greater insertion loss for a directional coupler constructed using the material with the higher dielectric absorption factor.

Ideally, to minimize losses, a coupler would be constructed with an air dielectric. However, currently available air dielectric couplers have a sheet metal housing, or outer conductor, that is expensive to manufacture and is difficult to surface mount due to co-planarity issues between the housing and attached connections, or leads. Further, the leads are fragile and easily damaged.

Therefore, there is still a need for improving couplers. Particularly, there is a need for a low loss coupling device or coupler that is easy and relatively inexpensive to manufacture and mount.

BRIEF DESCRIPTION OF THE DRAWINGS

The accompanying drawings, which are incorporated in and constitute a part of this specification, illustrate some embodiments of the invention and, together with a general description of the invention given above, and the detailed description of the embodiments given below, serve to explain the principles of the invention.

DETAILED DESCRIPTION

Figure 1:
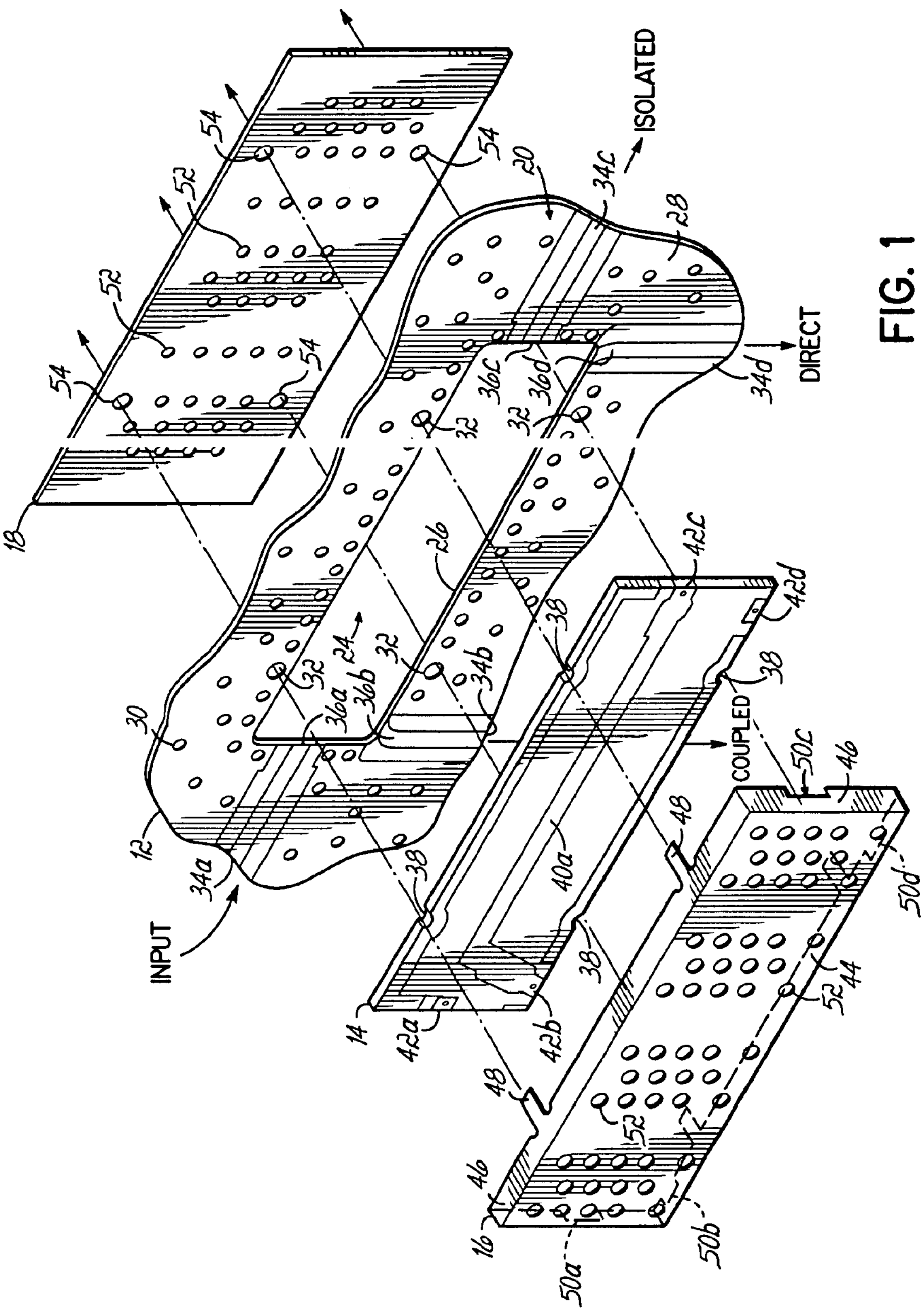
FIG. 1 is an exploded perspective view of an embodiment of a quadrature hybrid low loss coupler in accordance with principles of the present invention.
Figure 2:
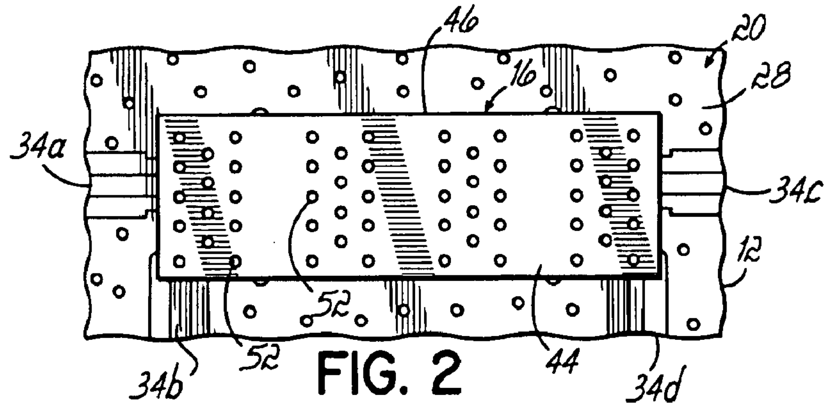
FIG. 2 is a plan view of a first side of the embodiment of a quadrature hybrid low loss coupler shown in FIG. 1.
Figure 3:
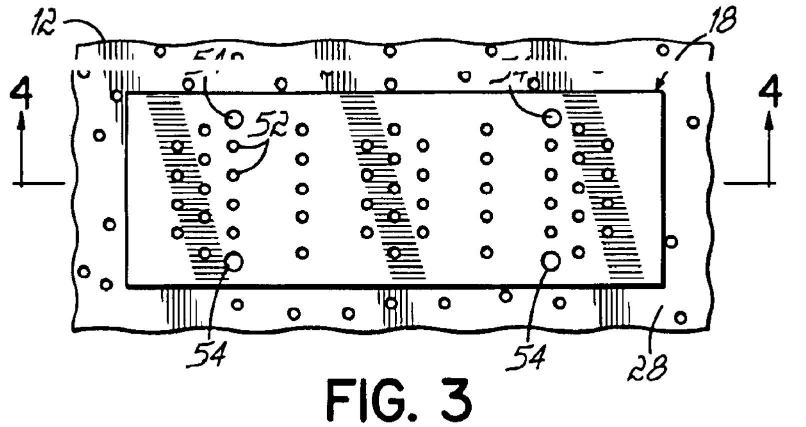
FIG. 3 is a plan view of a second side of the embodiment of a quadrature hybrid low loss coupler shown in FIG. 1.
Figure 4:
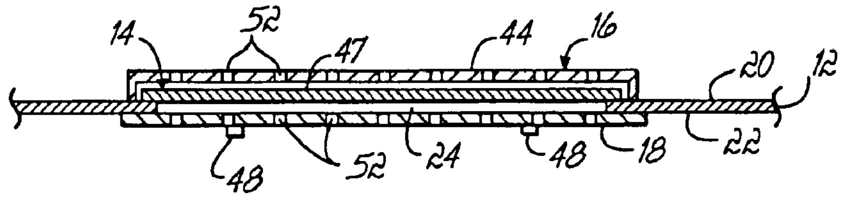
FIG. 4 is a cross-sectional view of the embodiment of a quadrature hybrid low loss coupler shown in FIGS. 1, 2 and 3 along line 4—4 of FIG. 3.

The present invention provides a low loss coupling device or coupler that is easy and relatively inexpensive to manufacture and mount by fabricating the device using a thin dielectric septum supported by the top surface of a host circuit board, having a cavity, with first and second shields on opposing sides of the septum. Such an arrangement allows air gaps of precise proportions, and reduces losses commonly inherent in coupling devices.

With reference to FIGS. 1 through 4, there is shown one embodiment 10 of a quadrature hybrid low loss coupler in accordance with principles of the present invention. Coupler 10 includes a circuit board, such as a radio frequency (RF) circuit board 12, a coupler board 14, a first metal shield 16, and a second metal shield 18.

RF circuit board 12 may be constructed of fiberglass, or some other suitable circuit board material well known to those skilled in the art. RF circuit board 12 has a first surface 20, seen in FIGS. 1 and 2, and a second surface 22, not appearing in FIG. 1; but, seen in FIG. 3. Formed or cut in circuit board 12, intermediate first surface 20 and second surface 22, is an opening or cavity 24, forming a wall 26 around cavity 24 between first surface 22 and second surface 24.

Deposited or otherwise placed on first surface 20 and on second surface 22 is ground plane 28. Ground plane 28 may be copper, a copper alloy or some other suitably conductive material. Connectivity between portions of ground plane 28 on the first surface 20 and on the second surface 22 may be provided by vias 30 and/or plated through holes 32 that may be used in the assembly.

Etched away or otherwise formed from ground plane 28 on at least one side of board 12, and leading up to cavity 24, are stripline traces 34*a–d* as illustrated in FIG. 1. Proximate the ends of stripline traces 34*a–d* are respective land areas 36*a–d*. The width of traces 34*a–d* and the relative spacing between the traces 34*a–d* and the proximity to ground plane 28, as well as the thickness of RF circuit board 12, determine the characteristic impedance of the stripline, and may be varied as desired by those skilled in the art to realize a desired characteristic impedance. It will be appreciated that RF circuit board 12 may include additional traces and land areas (not shown) for purposes of mounting other components to the board 12, and thereby realize practically any desired circuit.

Coupler board 14 may be constructed of dielectric material having a dielectric constant as desired or advantageously approaching that of air ($\in_r=1$). For example, coupler board 14 may be constructed of a material having a dielectric constant of nominally 2.2–2.3. Moreover, the thickness of coupler board 14 may be reduced such that the amount of dielectric material capable of absorbing RF power is reduced. Coupler board 14 may also advantageously include notches 38, corresponding to holes 32 in RF circuit board 12, for use in the assembly of coupler 10.

Figure 5:
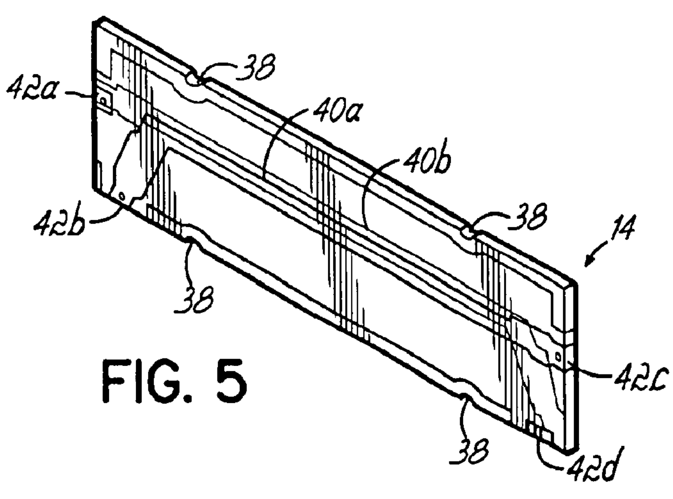
FIG. 5 is perspective view of the coupler board used in the embodiment of FIGS. 1 through 4, wherein the dielectric is depicted as translucent; and, FIG. 6 is a schematic block diagram of an embodiment of an RF amplifier containing a quadrature hybrid low loss coupler in accordance with principles of the present invention.

Referring also to FIG. 5, wherein the dielectric material is depicted as translucent, RF power is transmitted through conductive traces 40*a* and 40*b* which are deposited, etched or otherwise formed on opposing sides of coupler board 14, as illustrated in FIG. 5. Proximate the ends of the conductive traces 40*a* and 40*b* are connecting elements 42*a–d*. As shown, the traces 40*a*, 40*b* on opposites side of board 14 are overlapped in certain regions along their length. The relative distance between the traces 40*a*, 40*b*, controlled by the thickness of the dielectric material, and the amount of overlap of the traces 40*a*, 40*b* generally determine the capacitive coupling between the traces. Such coupling parameters may be adjusted by those skilled in the art. As seen in FIG. 5, each trace 40*a*, 40*b* has a portion which angles away from the portion that overlaps with the other trace. The angle of approach of traces 40*a* and 40*b* to portions where the traces overlap determines electrical parameters such as the voltage standing wave ration (VSWR), and may also be adjusted those skilled in the art.

First metal shield 16 may be stamped from sheet metal, and bent to form top 44 and side walls 46. The side walls raise the top and form a cavity area 47 (see FIG. 4). Alternatively, first metal shield 16 could be cast or otherwise formed. First metal shield 16 may advantageously include tabs 48, corresponding to holes 32 in RF circuit board 12 and notches 38 in coupler board 14, for use in assembly of the coupler 10. First metal shield 16 may also includes notches 50*a–d* (notches 50*a*, 50*b* and 50*d* shown in dashed lines), corresponding respectively to traces 34*a–d* on the first side of RF board 12, so as not to short traces 34*a–d* to ground plane 28. First metal shield 16 may also include perforations 52.

Second metal shield 18 may also be stamped from sheet metal, or otherwise formed, and include perforations 52. Second metal shield 18 may also advantageously include holes 54, corresponding to holes 32 in RF circuit board 12, notches 38 in coupler board 14, and tabs 48 of first metal shield 16, for use in the assembly of coupler 10.

In assembly, a first solder mask and paste is applied to the first surface 20 of RF circuit board 12. Coupler board 14 is then placed on and supported by the first surface 20 of RF circuit board 12, aligning connective elements 42*a–d* with land areas 36*a–d*, respectively. In doing so, a cavity 24 is formed on a side of the coupler board 14 based upon the thickness of the circuit board 12 and/or the depth of the opening/cavity 24 and walls 26. (See FIG. 4) Next, first metal shield 16 is placed over coupler board 12, passing tabs 48 past notches 38 and through holes 32, further locating coupler board 14 relative to RF board 12. A first soldering is then performed, soldering coupler board 14 and first metal shield 16 to RF circuit board 12. The metal shield 16 forms another cavity 47 on a side of the coupler board opposite cavity 24. A second solder mask and paste is then applied to the second surface 22 of RF circuit board 12. Second metal shield 18 is then placed against the second surface 22 of RF board 12 such that tabs 48 of first metal shield 16 pass through respective holes 54 of second metal shield 18. A second soldering is then performed, soldering second metal shield 18 to RF board 12 and first shield 16. Thus, assembly of circuit board 12, a dielectric septum 14, first metal shield 16, and a second metal shield 18 completes coupler 10 and forms cavities on either side of board 14.

When assembled, two cavities of air are formed on opposite sides of coupler board 14. One cavity is bounded by the coupler board 14 and the top 44 and walls 46 of first metal shield 16. The other cavity is bounded by coupler board 14, wall 26 around cavity 24 between first surface 22 and second surface 24 of RF board 12, and second metal shield 18. Thus, coupler board 14 acts, in effect, as a thin dielectric septum between the two cavities.

The formation of such cavities is particularly advantageous in the assembly of coupler 10. For example, when coupler board 14 is constructed of a material having a dielectric constant of nominally 2.2–2.3, coupler 10 may have an effective dielectric constant approaching 1.0, while still maintaining adequate mechanical separation. Thus, coupler 10 is easy to assemble and provides a reduction in losses by reducing the amount of dielectric material used in a coupler and by using air as a dielectric through the formation of the air cavities.

When coupled to a circuit such as the circuit on RF circuit board 12, coupler 10 may be configured as having an input port, an output or direct port, a coupled port, and an isolated port. For example, a signal may be coupled to trace 34*a* on RF board 12 as an input port of coupler 10. On coupler board 14, that input corresponds to trace 40*b* and connecting element 42*b*. One half of the input signal power emerges at the direct port, and is coupled to trace 34*d* through trace 40*b* and connecting element 42*d*. The other half of the signal power emerges at the coupled port, and is coupled through trace 40*a* to connecting element 42*b* and trace 34*b*. Little or no power emerges from the isolated port, at trace 34*c* corresponding to trace 40*a* and connecting element 42*c*.

Figure 6:
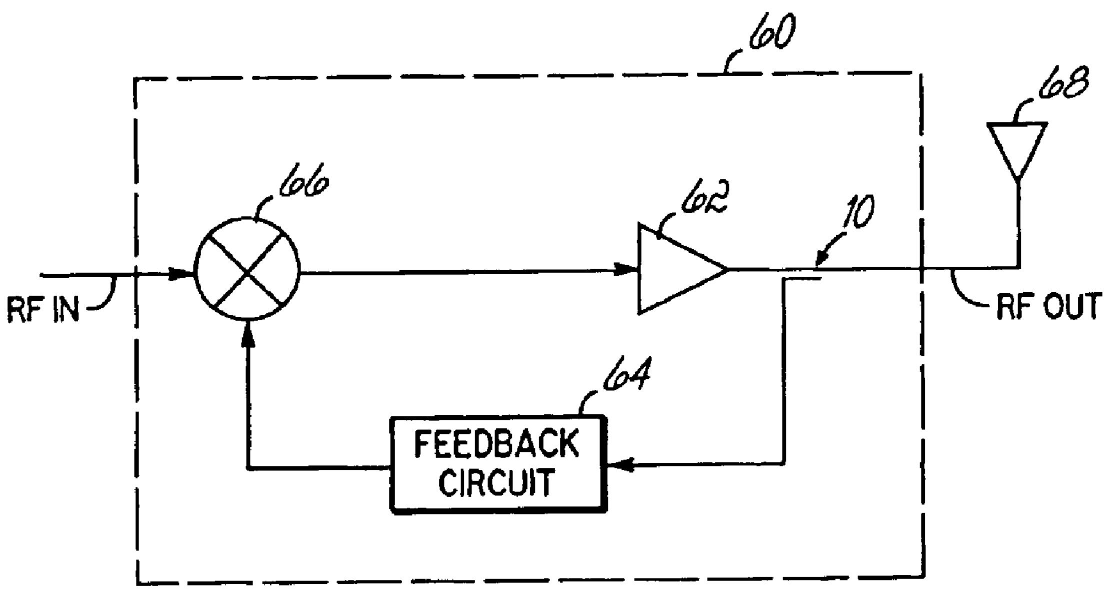

Referring now to FIG. 6, a schematic block diagram of an embodiment 60 of an RF amplifier containing a quadrature hybrid low loss coupler 10 in accordance with principles of the present invention is illustrated. RF amplifier 60 comprises coupler 10, amplifier 62, a feedback circuit 64, and mixer 66. Some or all of these components may be mounted to a circuit board, such as RF circuit board 12 shown in FIGS. 1 through 4.

Coupler 10 is coupled intermediate amplifier 62 and antenna 68 via input and direct ports, respectively. The coupled port of coupler 10 is coupled to feedback circuit 64. Feedback circuit 64 is coupled to mixer 68. Mixer 68 is also coupled to amplifier 62, and serves as the input RF IN to RF amplifier 60.

In operation, a signal to be amplified is coupled to RF amplifier 60 at RF IN, and to amplifier 62 through mixer 68. Amplifier 62 amplifies the signal, coupling the signal through coupler 10 to antenna 70, as indicated at RF OUT. A portion of the power from amplifier 62 is coupled via the coupled port of coupler 10 to feedback circuit 64. Feedback circuit 64 processes the coupled power to develop a signal that may be mixed with the input signal RF IN, such that the operation of RF amplifier 60 is improved. Thus, coupler 10, with reduced insertion losses, reduces the amount of amplifier output power necessary to overcome losses typically found in many couplers for a given output at antenna 70.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. For example, those skilled in the art may use principles of the present invention to construct a combiner or an N-way power splitter, where N denotes the number of ways power may be split, in additional to the embodiments of the couplers described herein. Further, those skilled in the art will appreciate that a coupling device may be constructed having practically any impedance as desired. Moreover, such a coupler, combiner or splitter may be either a stripline or a microstrip device. Therefore, the invention in its broader aspects is not limited to the specific details representative apparatus and method, and illustrative examples shown and described. Accordingly, departures may be made from such details without departure from the spirit or scope of applicants' general inventive concept.

What is claimed is:

1. A coupling device comprising:

a circuit board having first and second surfaces and an opening formed there between, and having a plurality of conductive traces;

a coupler board having opposites surfaces and conductive traces;

the coupler board being mounted with the circuit board at the opening;

first and second shields positioned proximate opposite surfaces of the coupler board and circuit board and forming cavities on opposite sides of the coupler board.

2. The coupling device of claim 1, wherein the said cavities formed are air cavities.

3. The coupling device of claim 1, further comprising ground planes, the conductive traces being formed on the first surface and a ground plane being formed on the first and the second surfaces.

4. The coupling device of claim 1, wherein the conductive traces on the coupler board are formed on the opposite surfaces.

5. The coupling device of claim 1, wherein the first and the second shields are stamped from sheet metal.

6. The coupling device of claim 1, wherein the coupling device forms at least one of a coupler, a combiner, and a splitter.

7. The coupling device of claim 1, wherein said coupler board is configured to cover the circuit board opening to form a cavity on one side of the coupler board.

8. The coupling device of claim 1, wherein at least one of said shields is raised to form a cavity proximate a side of the coupler board.

9. A coupling device to couple signals between various ports comprising:

a circuit board having opposite surfaces;

an opening formed in the circuit board between the opposite surfaces, the opening being free of obstruction to form an air opening;

a coupler board positioned with the circuit board to cover a portion of the air opening to create an air cavity proximate the coupler board;

the coupler board including opposing coupling traces that form an input port, an output port, and coupled port, the traces spanning across the air cavity to coincide with the air cavity.

10. The coupling device of claim 9, wherein the coupler board covers the entire opening on a side of the circuit board.

11. The coupling device of claim 9, wherein the coupling traces are formed on opposite sides thereof.

12. The coupling device of claim 11, wherein the circuit board includes conductive traces formed on at least one surface, the circuit board conductive traces coupling with a coupling trace on a surface of the coupler board when the coupler board is positioned with the circuit board.

13. The coupling device of claim 11, wherein the coupling traces have overlapping portions.

14. The coupling device of claim 9, further comprising a shield positioned on a surface of the circuit board opposite the coupler board.

15. The coupling device of claim 9, further comprising a shield positioned over the coupler board to form an additional air cavity on a side of the coupler board.

16. The coupling device of claim 11, wherein at least one of the coupling traces includes at least one of an angled portion and an overlapped portion.

17. The coupling device of claim 9, wherein the coupling traces form an input port, an output port, a coupling port and an isolation port.

18. The coupling device of claim 12, wherein said coupler board coupling traces are positioned thereon to couple with the conductive traces proximate the opening of the circuit board.

19. A method of integrating a coupling device into a circuit board having first and second surfaces, the method comprising:

forming a plurality of conductive traces on a surface of the circuit board;

forming an opening intermediate the first and second surfaces;

positioning a coupler board with opposing coupling traces adjacent one of the surfaces of the circuit board to cover the opening and form an air cavity, the coupling traces coinciding with the opening and air cavity and forming an input port, output port, and coupled port;

connecting the conductive traces with the coupling traces;

positioning a shield on another surface of the circuit board opposite the coupler board to cover the air cavity.

20. The method of claim 19, further comprising positioning the coupler board to cover the opening.

21. The method of claim 19, further comprising positioning a shield over the coupler board.

22. The method of claim 21, wherein the shield is configured to form another air cavity with the coupler board.

23. A signal combining device comprising:

a coupler board with coupling traces formed on opposite surfaces thereof to form at least an input port, a direct port and a coupled port;

shields positioned proximate the opposite surfaces of the coupler board;

the shields configured to form air cavities with the coupler board at opposite surfaces of the board to surround the coupling traces with air.

24. The signal combining device of claim 23, further comprising:

a circuit board positioned intermediate one of the surfaces and a respective shield.

25. The signal combining device of claim 24, wherein the circuit board includes conductive traces thereon positioned to connect with coupling traces on the coupler board.

26. A signal splitting device comprising:

a coupler board with coupling traces formed on opposite surfaces thereof;

shields positioned proximate the opposite surfaces;

the shields configured to form cavities with the coupler board at opposite surfaces of the board.

27. The signal splitting device of claim 26, further comprising:

a circuit board positioned intermediate one of the surfaces and a respective shield.

28. The signal splitting device of claim 26, wherein the circuit board includes conductive traces thereon positioned to connect with coupling traces on the coupler board.

29. A circuit board having first and second surfaces, and comprising:

a ground plane formed on the first and the second surfaces;

an opening formed intermediate the first and the second surfaces; and, a plurality of conductive traces etched from the ground plane on the first surface, and leading up to the opening;

the conductive traces configured to couple with ports of a hybrid coupler and the opening forming a cavity for the coupler.

30. A process of assembling a coupling device comprising:

providing a circuit board having an opening and land areas;

placing a coupler board having connective elements on the circuit board over the opening, and aligning the connective elements with the land areas;

placing a first shield over the coupler board;

soldering the first shield and coupler board to the circuit board;

placing a second shield against a surface of the circuit board opposite the coupler board; and, soldering the second shield to be held on the circuit board.

31. The process of claim 30, the circuit board having holes proximate the opening, the first metal shield having respective tabs, and the second metal shield having respective holes, further comprising passing the tabs of the first metal shield through the holes in the circuit board and through the holes in the second metal shield to align the shields over the opening.

32. The process of claim 31, wherein the coupler board has notches, further comprising passing the tabs through the notches to align the coupler board with the opening.

* * * * *

UNITED STATES PATENT AND TRADEMARK OFFICE

CERTIFICATE OF CORRECTION

PATENT NO. : 6,956,449 B2
APPLICATION NO. : 10/351931
DATED : October 18, 2005

INVENTOR(S) : Robert R. Snyder and Mark A. Hilbert

It is certified that error appears in the above-identified patent and that said Letters Patent is hereby corrected as shown below:

Title, Column 2, ABSTRACT reads "...and a ground plane, a coupler board having opposites sides..." and should read -- ... and a ground plane, a coupler board having opposite sides... --.

Title, Column 2, ABSTRACT reads "... and conductive traces, and first and, second metal shields." and should read -- ... and conductive traces, and first and second metal shields. --.

Column 1, line 47 reads "...with, coaxial connectors mounted to the containers to pro-…" and should read -- ...with coaxial connectors mounted to the containers to pro-… --.

Column 1, line 54 reads "...manufacturing of the couplers, as the well as the products..." and should read -- ...manufacturing of the couplers, as well as the products… --.

Column 1, line 63 reads "...from insertion losses. Insertions losses may be generally..." and should read -- ...from insertion losses. Insertion losses may be generally... --.

Column 2, line 56 reads "FIG. 5 is perspective view of the coupler board used in the..." and should read -- FIG. 5 is a perspective view of the coupler board used in the …--

Column 3, line 60 reads "...shown, the traces 40*a*, 40*b* on opposites side of board 14 are..." and should read -- ...shown, the traces 40*a*, 40*b* on opposite sides of board 14 are... --.

Column 4, line 5 reads " ...(VSWR), and may also be adjusted those skilled in the art..." and should read -- ...(VSWR) may also be adjusted by those skilled in the art... --.

Column 4, line 13 reads "...coupler 10. First metal shield 16 may also includes notches..." and should read -- ...coupler 10. First metal shield 16 may also include notches... --.

Column 5, line 43 reads "...is not the intention of the applicant to restrict or in any way..." and should read -- ...is not the intention of the applicants to restrict or in any way… --.

Column 5, line 50 reads "...number of ways power may be split, in additional to the..." and should read -- ...number of ways power may be split, in addition to the... --.

UNITED STATES PATENT AND TRADEMARK OFFICE

CERTIFICATE OF CORRECTION

PATENT NO. : 6,956,449 B2

APPLICATION NO. : 10/351931

DATED : October 18, 2005

INVENTOR(S) : Robert R. Snyder and Mark A. Hilbert

It is certified that error appears in the above-identified patent and that said Letters Patent is hereby corrected as shown below:

Column 5, line 56 reads "...details representative apparatus and method, and illustrative..." and should read -- details, representative apparatus and method, and illustrative... --.

Column 5, CLAIM 1, line 66 reads "...a coupler board having opposites surfaces and conductive..." and should read -- ...a coupler board having opposite surfaces and conductive… --.

Signed and Sealed this

Twelfth Day of December, 2006

JON W. DUDAS

*Director of the United States Patent and Trademark Office*